US007981305B2

(12) United States Patent
Koh et al.

(10) Patent No.: US 7,981,305 B2
(45) Date of Patent: Jul. 19, 2011

(54) HIGH-DENSITY FIELD EMISSION ELEMENTS AND A METHOD FOR FORMING SAID EMISSION ELEMENTS

(75) Inventors: Seong Jin Koh, Manfield, TX (US); Gerald W. Gibson, Jr., Danbury, CT (US)

(73) Assignee: Agere Systems Inc., Allentown, PA (US)

( * ) Notice: Subject to any disclaimer, the term of this patent is extended or adjusted under 35 U.S.C. 154(b) by 213 days.

(21) Appl. No.: 12/506,090

(22) Filed: Jul. 20, 2009

(65) Prior Publication Data

US 2009/0280585 A1 Nov. 12, 2009

Related U.S. Application Data

(63) Continuation of application No. 11/057,690, filed on Feb. 14, 2005, now Pat. No. 7,564,178.

(51) Int. Cl.
*B44C 1/22* (2006.01)
*G01L 21/30* (2006.01)
*H01L 21/302* (2006.01)

(52) U.S. Cl. ................ 216/58; 216/11; 216/59; 216/67; 216/79; 438/706; 438/710; 438/714; 438/733

(58) Field of Classification Search .................. 438/706, 438/710, 714, 733
See application file for complete search history.

(56) References Cited

U.S. PATENT DOCUMENTS

| | | | | |
|---|---|---|---|---|
| 5,363,021 | A * | 11/1994 | MacDonald | 315/366 |
| 5,527,200 | A | 6/1996 | Lee et al. | |
| 5,583,393 | A * | 12/1996 | Jones | 313/495 |
| 5,783,905 | A | 7/1998 | Greschner et al. | |
| 5,921,838 | A * | 7/1999 | Pack et al. | 445/50 |
| 6,232,705 | B1 | 5/2001 | Forbes et al. | |
| 6,235,214 | B1 * | 5/2001 | Deshmukh et al. | 216/67 |
| 6,369,505 | B2 | 4/2002 | Tjaden et al. | |
| 6,461,969 | B1 * | 10/2002 | Lee et al. | 438/706 |
| 7,564,178 | B2 | 7/2009 | Koh et al. | |
| 2002/0185465 | A1 * | 12/2002 | Knappenberger | 216/2 |
| 2005/0001536 | A1 | 1/2005 | Yamamoto et al. | |

* cited by examiner

*Primary Examiner* — Shamim Ahmed

(57) ABSTRACT

A method for forming high density emission elements and field emission displays formed according to the method. Oxygen and a silicon etchant are introduced into a plasma etching chamber containing a silicon substrate. The oxygen reacts with the silicon surface to form regions of silicon dioxide, while the silicon etchant etches the silicon to form the emission elements. The silicon dioxide regions mask the underlying silicon during the silicon etch process. High density and high aspect ratio emission elements are formed without using photolithographic processes. The emission elements formed according to the present invention provide a more uniform emission of electrons. Further, a display incorporating emission elements formed according to the present invention provides increased brightness. The reliability of the display is increased due to the use of a plurality of emission elements to supply electrons for stimulating the phosphor substrate material to produce the image.

23 Claims, 8 Drawing Sheets

HIGH-DENSITY FIELD EMISSION ELEMENTS AND A METHOD FOR FORMING SAID EMISSION ELEMENTS

CROSS REFERENCE TO RELATED APPLICATION

This present application is a continuation of U.S. patent application Ser. No. 11/057,690, entitled "HIGH-DENSITY FIELD EMISSION ELEMENTS AND A METHOD FOR FORMING SAID EMISSION ELEMENTS" filed on Feb. 14, 2005, by Seong Jin Koh, et al., U.S. Pat. No. 7,564,178. The above-mentioned application is commonly assigned with the present application and incorporated herein by reference in its entirety.

FIELD OF THE INVENTION

This invention relates generally to field emission electron sources and more particularly to field emission elements formed from a silicon-based semiconductor material and a method for forming the field emission elements.

BACKGROUND OF THE INVENTION

In the technology of field emission devices and structures, an electric potential applied to or near a pointed surface of an emission element or emitter (or a plurality of such emission elements or emitters configured in an array) stimulates the emission of electrons from the pointed surface. A shape of the emitting surface, e.g. a pointed emitter tip, is selected to concentrate the electric field formed by the potential and thus maximize electron emissions into a vacuum surrounding the emitter. Increasing the electrical field intensity increases a current density of the emitted electrons, and the intensity is inversely further related to a radius of curvature of the emitting surface shape. Extremely pointed field emission tips are therefore desired.

In a field emission display, electrons emitted from the emission element are accelerated in a vacuum to impinge a phosphor screen that glows when struck by the electron. By contrast, in a cathode ray tube display, the electrons are generated by thermal emission from a heated cathode surface. In the field emission display the electrons are emitted from a "cold" cathode surface.

As illustrated in FIG. 1, in a field emission display 6, electrons are generated by the field emission process from a cathode electrode 8 comprising an array of millions of submicrometer emission elements 10 formed within openings 11 in an insulator layer 12. Application of a voltage $V_g$ between the cathode electrode 8 (overlying a cathode substrate 14) and a gate electrode 16 forms an electric field between the cathode electrode 8 and the gate electrode 16. The electric field causes the emission of electrons from the emission elements 10. In FIG. 1, the emitted electrons are represented by arrowheads 20.

A shape of the emission elements 10 is selected to maximize electron emission, as sharper emission elements produce more electrons and thus a brighter image. As the number of emission elements supplying electrons to each display pixel increases, the display reliability also increases, as it is known that the electron emissions from an emission element can decrease with time.

A voltage $V_a$ (greater than the voltage $V_g$) applied between the cathode electrode 8 and an anode electrode 24 accelerates the electrons toward a phosphor screen 25 (or other electroluminescent display device). The phosphor screen 25 and the anode electrode 24 are supported by a transparent anode substrate 26. Responsive to the impinging electrons, phosphor pixels comprising the phosphor screen 25 emit light observable from a surface 30 of the anode substrate 26. Typically, a plurality of emission elements 10 supply impinging electrons for a single pixel, wherein the plurality of emission elements 10 are insulated from other pluralities of emission elements 10, such that each plurality is independently controllable for emitting electrons that strike a single pixel.

For producing a color image, each pixel comprises a color pixel triad, further comprising a red sub-pixel, a green sub-pixel and a blue sub-pixel. The emission elements 10 associated with a pixel are segregated into a matrix of insulated addressable arrays, such that a first array is associated with the red sub-pixel, a second array is associated with the green sub-pixel and a third array is associated with the blue sub-pixel. To produce a blue color on the display, for example, the third emitter group is activated to emit electrons that impinge on the blue sub-pixel.

To permit operation at relatively low operating voltages, the emission elements 10 are typically constructed from a material exhibiting a low work function (such as molybdenum, where the work function is a measure of the amount of energy required for an electron to escape from the metal into the surrounding vacuum) to increase the electron emissions and shaped in the form of points 34. As can be seen from FIG. 1, the emission elements 10 (also referred to as cones) have a generally triangular shape with each emission element 10 pointed in a direction of the phosphor screen 25 such that electrons emitted from the emission elements 10 are directed toward the screen 25.

Application of the voltage $V_g$ between the gate electrode 16 and the cathode electrode 8 controls emission of electrons from the emission elements 10. As can be seen in FIG. 1, the gate electrode 16 is disposed above the cathode electrode 8. To permit proper electron flow from the emitter emission elements 10 to the anode electrode 24, the openings 11 formed in the gate electrode 16 and the insulating layer 12 must be properly positioned with respect to the emission elements 10. A size and location of the openings affect not only the magnitude of electron flow from the emission elements 10, but also determine the shape and direction of the electron flux. The opening size and circumferential proximity to each emission element 10 determines the voltage $V_g$ that is required for effective control of the electron emissions, while alignment of a hole axis with respect to an element axis controls the electron beam direction.

Opening/element alignment and opening size have been difficult to control in the prior art due to the extremely small geometries and tolerances associated with the openings 11 and the emission elements 10. Typically, to obtain opening/element alignment it has been necessary to employ a difficult and time-consuming masking step to form the openings 11, but slight errors in either the mask or the mask alignment relative to the substrate 14 can detrimentally affect the opening/element alignment and thus the emission of electrons. The difficulties encountered in fabricating such arrays increase significantly as the dimensions of the emitter emission elements 10 are reduced to a sub-micrometer or nanometer scale.

In addition to opening/element alignment concerns, according to the prior art the emission elements 10 are fabricated using known photolithographic masking, patterning and etching steps. This process limits element density and element quality. In particular, the density is limited by resolution of the photolithographic process. Also, since the emission elements are tapered, each occupies a larger area at a bottom surface than at a tip apex. Thus the required tapered base limits the emission element density, which lowers the image brightness. A higher element density is therefore desired to achieve a higher image brightness.

In an effort to overcome the disadvantages associated with the use of the photolithographic process for forming emitter emission elements, current research efforts form the emission elements 10 by directing a laser beam toward a substrate surface. When the laser beam strikes the surface material is removed therefrom, with the material remaining forming the emission elements 10. This process requires a laser scan over the entire substrate and thus can be time consuming. Disadvantageously, the emission elements 10 produced by the laser technique may not be uniform throughout the substrate.

Etching techniques to remove material layers from a silicon substrate are commonly used in semiconductor fabrication processes. Various dry and wet etchants are available, with each etchant offering specific etching characteristics, including material selectivity, etch uniformity and edge profile control. Plasma etching is one form of dry etching that employs a gas and plasma energy to create a chemical reaction that etches the desired material layer.

A conventional plasma etching system comprises a chamber, a vacuum system, a gas supply and a power source. After loading a silicon wafer onto a pedestal in the chamber, the vacuum system reduces the pressure and a reactive gas is supplied to the chamber. An electrode in the chamber is energized by a radio frequency power source to energize the gas to a plasma state, producing ions, electrons and radicals. A radio frequency bias applied to the substrate develops an electric field proximate the substrate to attract ions of the reactive gas to the substrate. These ions and the radicals synergistically etch the substrate according to a pattern in a mask overlying the substrate.

Selection of a specific reactive gas is based on the material to be removed during the etch process. For example, for etching a silicon dioxide material layer, $CF_4$ and oxygen are typically used. In the energized state, the $CF_4$ is disassociated into highly reactive carbon and fluorine radicals, in addition to a number of ions. The radicals and ions interact with the substrate, where the fluorine attacks the silicon dioxide, converting the silicon dioxide to a volatile material that is removed from the chamber by the vacuum system. Typically, the plasma etch process is performed at a temperature between about 15 and 45° C., and at a pressure between about 5 and 100 mTorr, depending on the reactor type employed for the process.

BRIEF SUMMARY OF THE INVENTION

One embodiment of the present invention comprises a method for fabricating field emission elements within a silicon substrate. The method comprises providing a plasma etching chamber, supplying oxygen to the chamber, supplying a silicon etchant to the chamber, controlling a ratio of the oxygen to the silicon etchant and etching silicon from the silicon substrate to form the emission elements in the substrate, wherein an upper surface of the emission elements exhibits a generally convergent shape.

According to another embodiment the invention comprises a field emission display further comprising: an anode, a doped silicon substrate, emission elements randomly disposed on a surface of the silicon substrate and having a convergent tip region in a direction of the anode, an insulating layer overlying the substrate, wherein the tip region of each emission element is below an upper surface of the insulating layer and a gate overlying the insulating layer, wherein openings disposed through the insulating layer and the gate expose the tip region of certain ones of the emission elements, and wherein in regions of the substrate absent openings the tip region of other ones of the emission elements remain covered by the insulating layer.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Before describing in detail the particular method and apparatus for forming field emission elements according to the present invention, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe other elements and steps pertinent to understanding the invention in greater detail.

Figure 1:
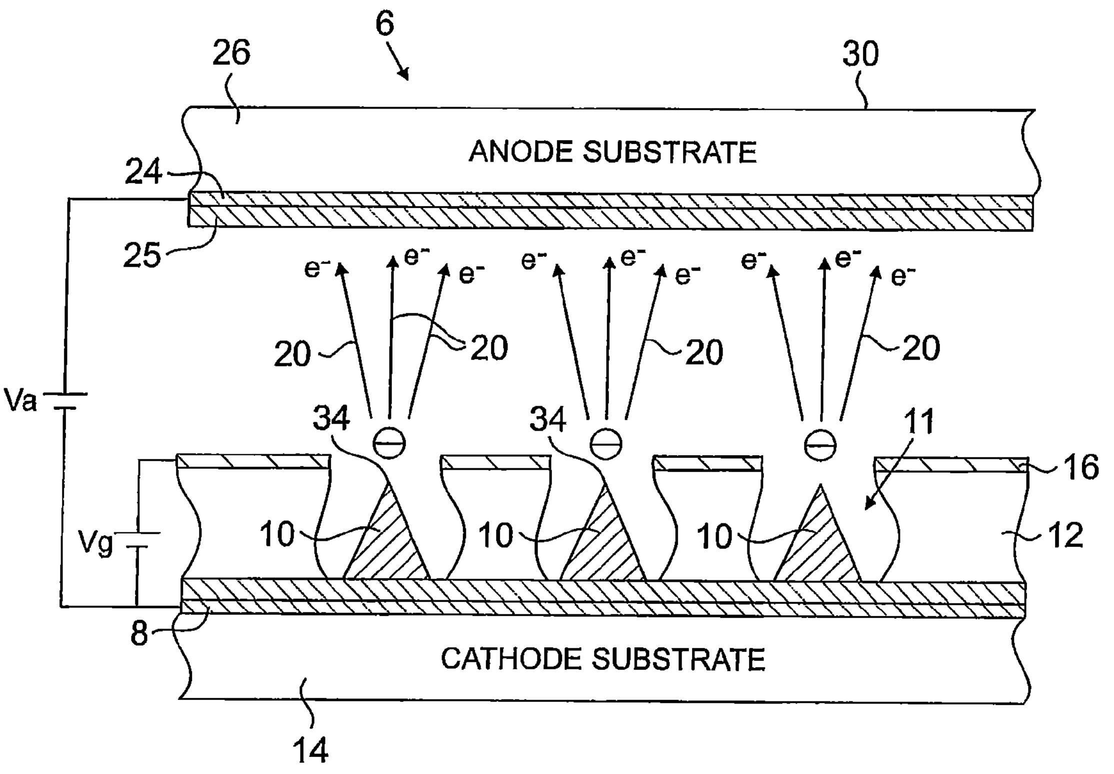
FIG. 1 (PRIOR ART)
FIG. 1 is a cross-sectional illustration of prior art field emission elements.
Figure 2:
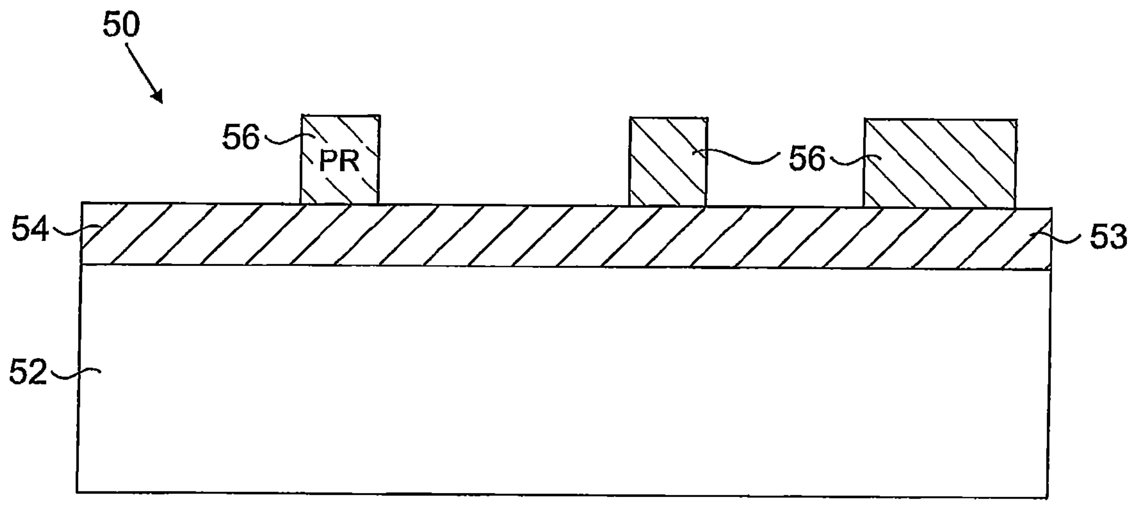
FIGS. 2-9 are cross-sectional illustrations of a substrate during sequential processing steps for forming field emission elements according to one method of the present invention.

A method for forming emission elements 10 according to the present invention begins as illustrated in FIG. 2, wherein a substrate 50 comprises a heavily-doped single crystalline silicon layer 52, having an upper surface 53, and an overlying silicon nitride layer 54. Typically, the doping density of the silicon layer 52 produces a sheet resistance of at least 10-30 ohms square or a doping density as required to impart sufficient conductivity to the silicon layer 53, according to a field emission display into which the silicon layer 53 is incorporated.

A photoresist layer is deposited overlying the silicon nitride layer 54 and patterned according to known techniques to form a patterned photoresist layer 56. The pattern in the photoresist layer 56 is determined by a desired pattern for the field emission elements 10.

Figure 3B:
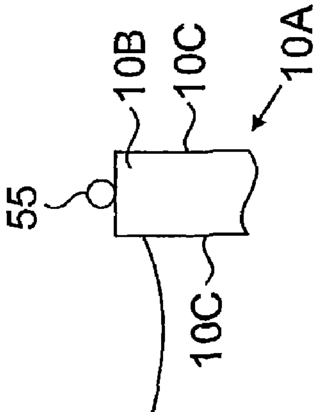
Figure 3A:
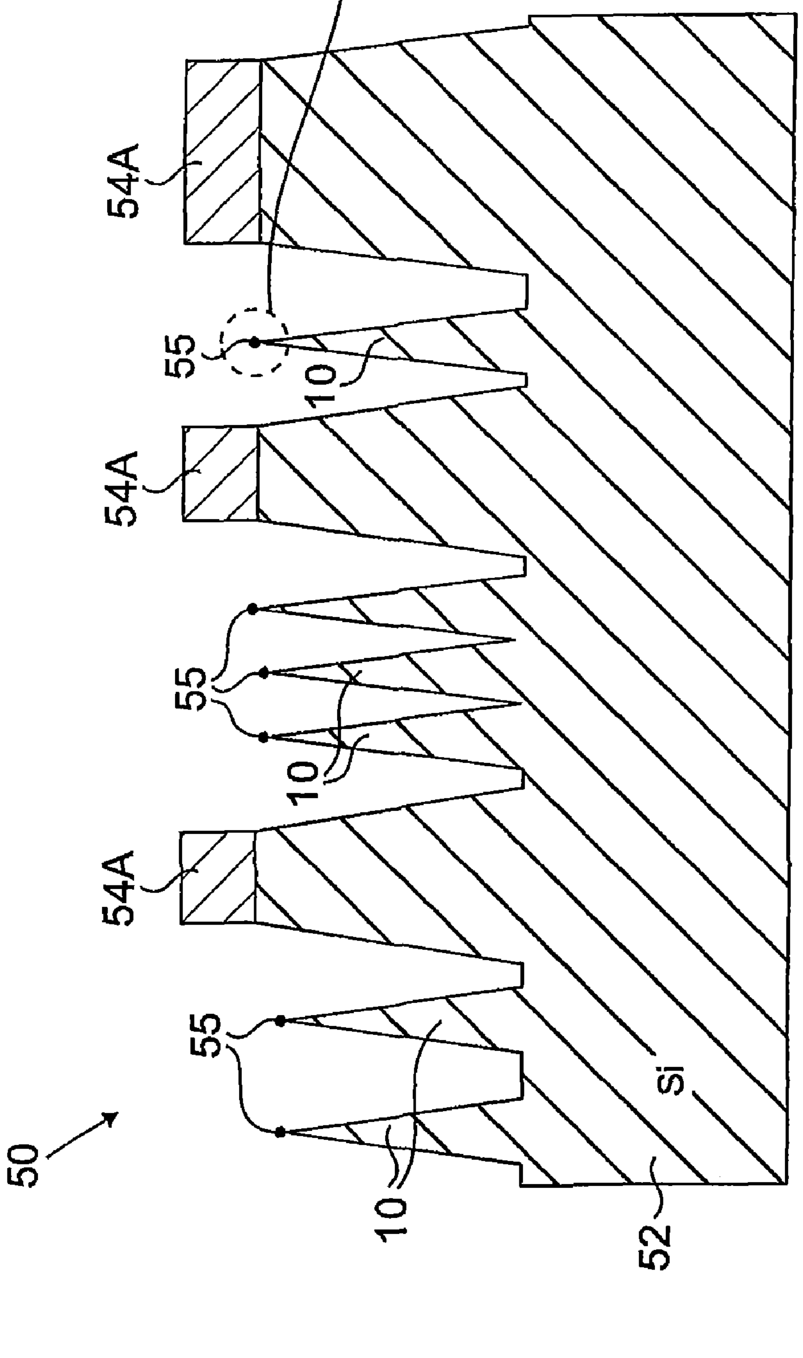

Using the pattern of the photoresist layer 56, the underlying silicon nitride layer 54 is etched according to known techniques (for example, using a $CF_4$ chemistry) to form silicon nitride regions 54A (see FIG. 3A) that during a subsequent etch process (using a different etch chemistry from the silicon nitride etch chemistry) prevent formation of the field emission elements 10 in regions of the silicon layer 52 immediately below the silicon nitride regions 54A. Thus FIG. 3A is a cross-sectional view after formation of the silicon nitride regions 54A, removal of the photoresist layer 56 by plasma etching or by other techniques known in the art and etching of the substrate 52 to form the emission elements 10. In another embodiment, the silicon nitride regions 54A may be of a different size than illustrated or may be absent.

According to the present invention, the emission elements 10 are formed in the silicon layer 52 using a plasma etch process without the use of a photolithographic mask, thus reducing emission element fabrication costs. In addition, the present invention provides higher density and higher aspect ratio emission elements than the prior art techniques, resulting in better element uniformity and a brighter display image. During the plasma etch process, oxygen ($O_2$) and sulfur hexafluoride ($SF_6$) are supplied to the etching chamber in a ratio of oxygen to sulfur hexafluoride of about 1.5:1. Preferred flow rates are about 30 sccm for the oxygen and about 20 sccm for the sulfur hexafluoride. Hydrogen bromine (HBr) is also supplied to the etch chamber at a flow rate of about 50 sccm. In another embodiment, a chlorine-based compound (or other compounds including an element from Column VIIA of the periodic table) can be used in lieu of the hydrogen bromine and/or the sulfur hexafluoride.

During the etch process, a chamber pressure is maintained at about 30 mTorr. A radio frequency current generating about 60 W of power biases the substrate 50. A radio frequency source supplies about 1500 W to the plasma-forming electrode in the chamber.

The stated etch parameters are merely exemplary. Those skilled in the art recognize that variations of up to at least 20% from the stated parameters may produce desired results, i.e., formation of the emission elements 10. Further, the etch parameters may vary due to the design of the etching tool and the conditions of the chamber.

During the etch process, oxygen radicals combine with silicon on the upper surface 53 to form silicon dioxide regions 55, also referred to as micro-masks. These silicon dioxide regions 55 are not easily etched due to the material selective nature of the etchants employed, i.e., a higher etch selectivity to silicon than to silicon dioxide. Thus the emission elements 10 are formed as regions of the silicon layer 52 adjacent the silicon dioxide regions 55 are etched, while silicon regions masked by the silicon dioxide regions 55 remain substantially intact (i.e., are etched at a much slower rate).

This phenomenon of forming the silicon dioxide regions 55 and etching regions of the silicon layer 52 that are not masked by the silicon dioxide regions 55 is referred to as micro-masking. The process occurs when the etch chemistry is such that both etching (of the silicon) and deposition (of silicon dioxide to form the silicon dioxide micro-masks) occur simultaneously at a ratio of the rate of deposition to the rate of etching determined by the reactants employed during the process.

Both the SF6 gas and the HBr gas, in an embodiment in which it is present, participate in the silicon etching process. The SF6 etches faster but is less selective to the silicon dioxide and more isotropic (i.e., the resulting etch profile lacks the perpendicularity of a substantially anisotropic etch). The combination of the fluorine and the silicon form volatile SF4 that is removed from the etch chamber. The HBr gas is more selective to the silicon dioxide and etches very anisotropically, because the bromine is less reactive than fluorine and requires a greater ion bombardment energy to form volatile SiBr4.

The ratio of SF6 to HBr determines the degree of selectivity to the silicon dioxide and the anisotropic features of the resulting etch. Some of the oxygen ions and radicals combine with the silicon to form the silicon dioxide regions 55, since silicon dioxide is not a volatile material.

The ions and radicals that etch the substrate 50 are derived from both the SF6 and the HBr (in an embodiment where it is present). The ions strike the surface of the silicon layer 52 substantially normally or anisotropically because they are attracted by the negative potential applied to the substrate 50. Further, since the ions strike the surface at about 90 degrees to the surface, they tend to drive the etch process vertically, rather than laterally, resulting in a predominantly vertical etch process, creating the emission elements 10 with a higher density than the prior art processes. The free radicals, which carry no charge, strike the silicon layer 52 from substantially all directions because they are not attracted to the substrate 50. Instead the motion of the radicals is influenced by collisions with other atoms in the chamber and therefore is essentially random in all directions. As the ions impinge the exposed silicon surface, they tend to accelerate the etch process that was begun by the radicals in the first several monolayers of the silicon layer 52.

As the etching process begins, the upper surface 53 of the silicon layer 52 comprises a relatively flat surface. As the silicon dioxide regions 55 are formed, the etch process removes material adjacent the silicon dioxide regions 55, forming substantially rectangular vertical structures 10A as illustrated in the close-up view of FIG. 3B. As the etch process continues, enhanced ion bombardment at corners 10B of the rectangular vertical structures 10A, due to a larger electric field at corners than on flat surfaces, forms generally convergent emission elements 10, e.g., conical or pointed emission elements. Formation of a polymer material on sidewalls 10C of the region 10A can also contribute to formation of the convergent tips of the emission elements 10, as the polymer masks the side surfaces 10C from the bombarding ions and radicals. Following formation of the emission elements 10, the silicon dioxide regions 55 are removed by selective isotropic etching.

Figure 4:
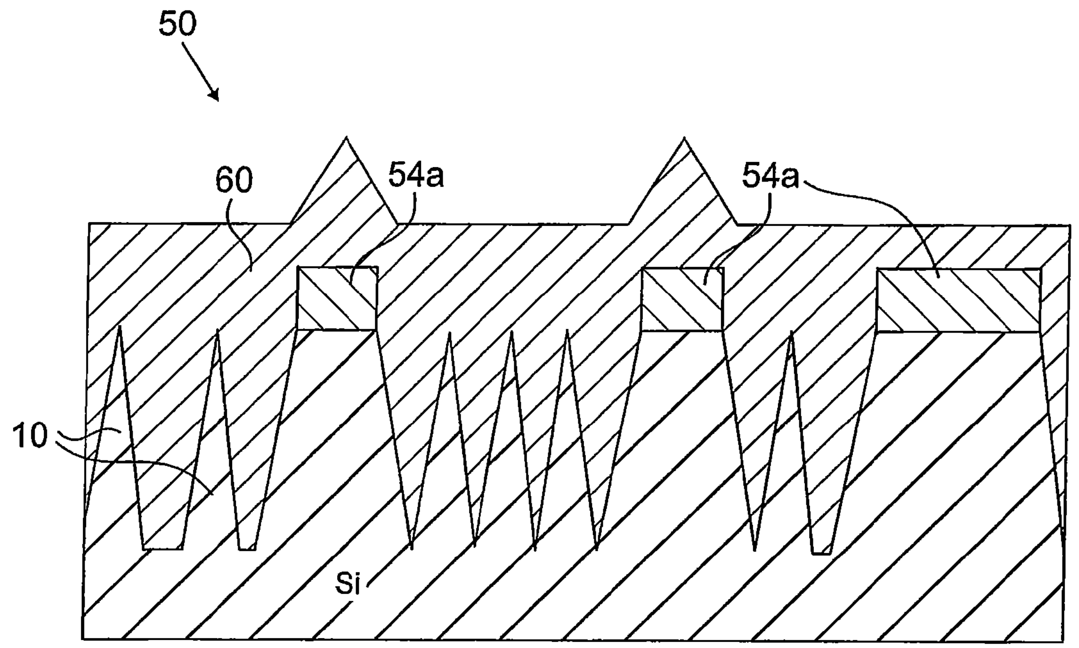
Figure 12:
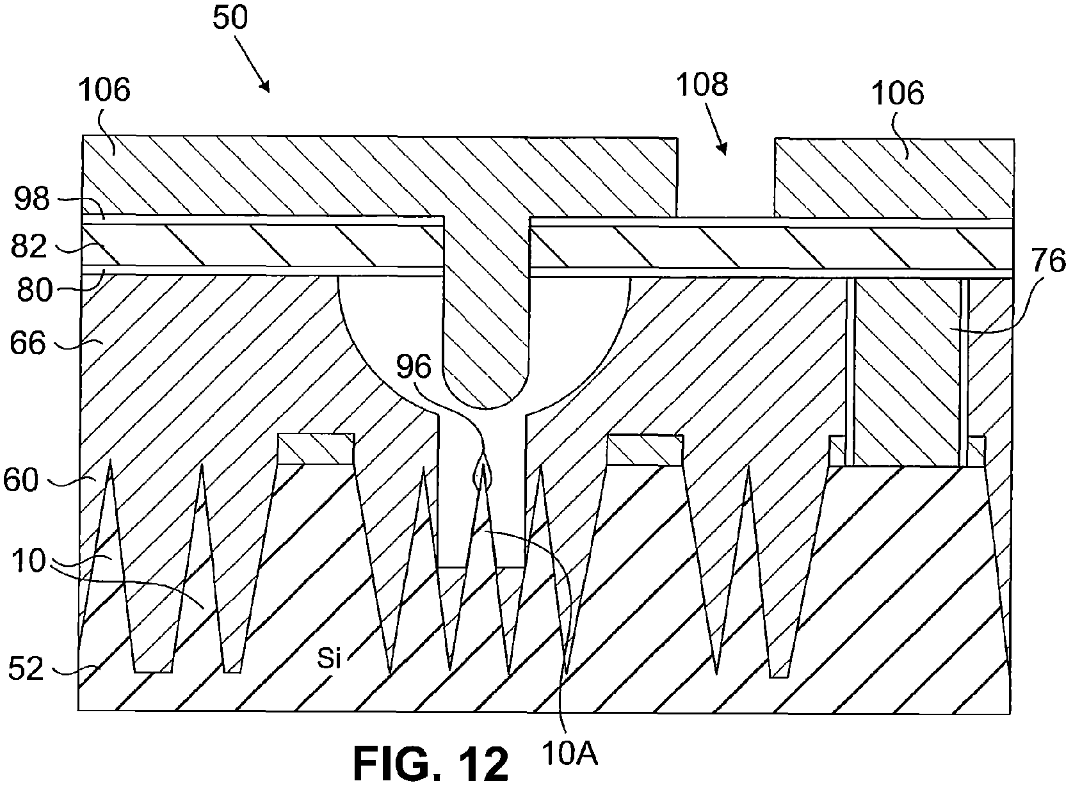

Beginning in FIG. 4 and continuing through FIG. 12, the substrate 50 undergoes a series of processing steps to form electrically conductive paths to the emission elements 10, through which current is supplied to cause the emission of electrons. As illustrated in FIG. 4, a layer of silicon dioxide 60 is deposited by a high-density plasma or conformal chemical vapor deposition technique. Plasma deposition is preferred due to its excellent gap filling results.

Figure 5:
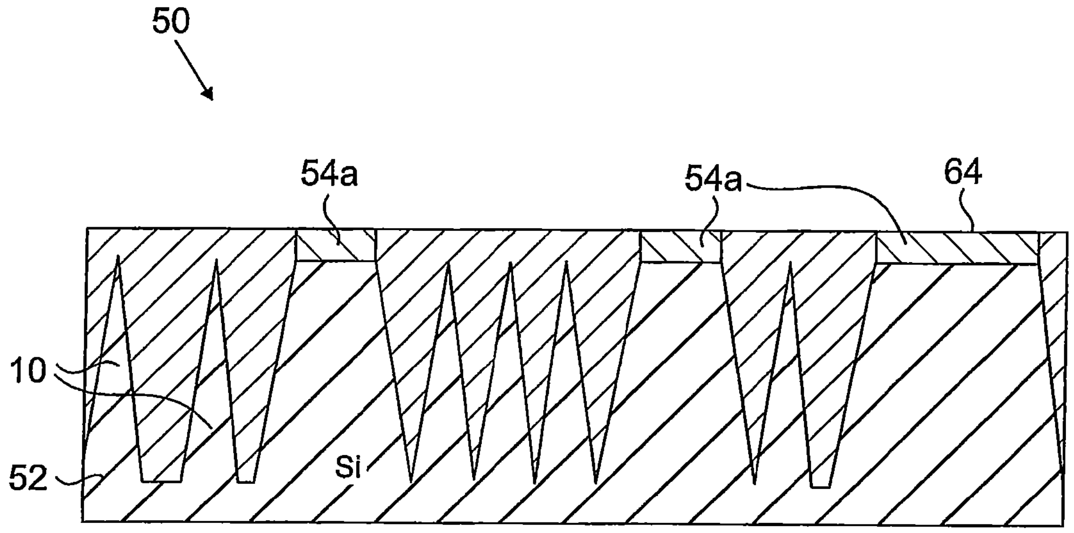

A chemical/mechanical polishing step (CMP) is performed to planarize an upper surface 64 of the substrate 50. See FIG. 5.

Figure 6:
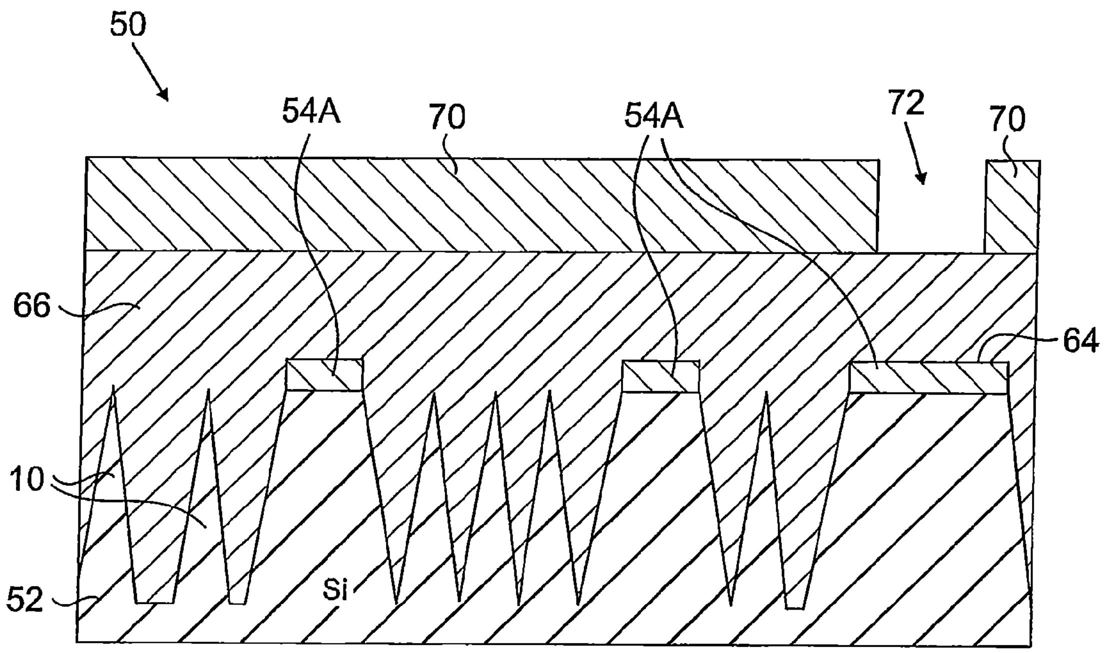

As illustrated in FIG. 6, a silicon dioxide layer 66 is formed overlying the upper surface 64. A photoresist layer 70 is formed overlying the silicon dioxide layer 66 and patterned to form an opening 72 therein. A corresponding opening is etched in the silicon dioxide layer 66 and the silicon nitride region 54A, after which the photoresist layer 70 is removed.

Figure 7:
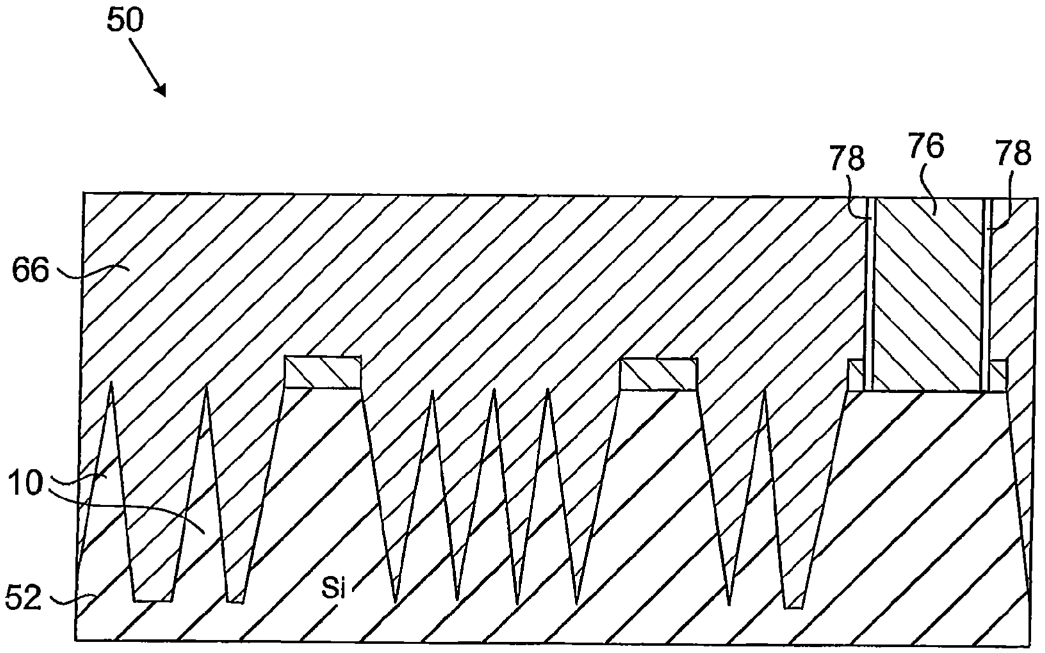

As illustrated in FIG. 7, a conductive plug 76 (for example, comprising tungsten) and a barrier layer 78 (for example, comprising titanium or titanium nitride) are formed according to known techniques in the opening in the silicon dioxide layer 66 and the silicon nitride region 54A. The conductive plug 76 provides an electrical connection to the emission elements 10 through the highly doped silicon layer 52. In one embodiment, a plurality of electrically insulated emission element arrays are formed in the silicon layer 52, wherein each element array is associated with a display sub-pixel. Such arrays can be formed by fabricating insulating regions, such as trench isolation regions, in the silicon layer 52. A tungsten plug, such as the conductive plug 76, is formed in electrical contact with each array to independently control the emission of electrons from that array. Thus selected arrays can be energized to emit electrons while others remain inactive, thereby producing images on the display.

Figure 8:
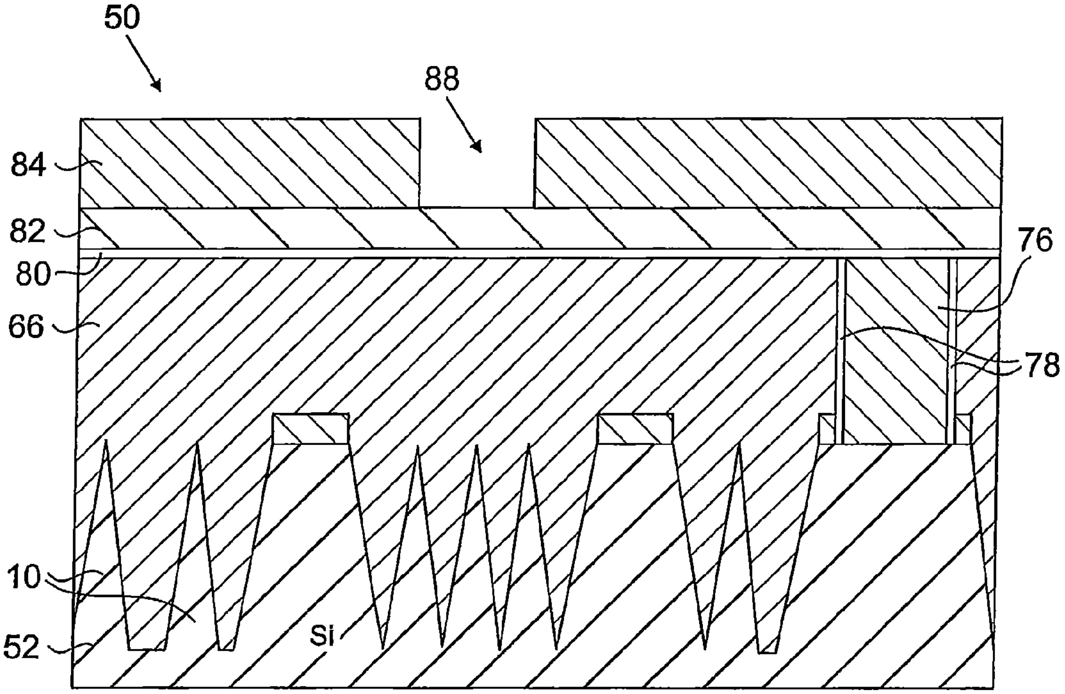

FIG. 8 depicts in stacked relation overlying the silicon dioxide layer 66, a barrier layer 80, an aluminum layer 82 and a photoresist layer 84, the latter patterned to form an opening 88 therein. The barrier layer 80 typically comprises a bilayer further comprising a titanium layer and a titanium-nitride layer to avoid migration of the aluminum into the silicon dioxide.

Figure 9:
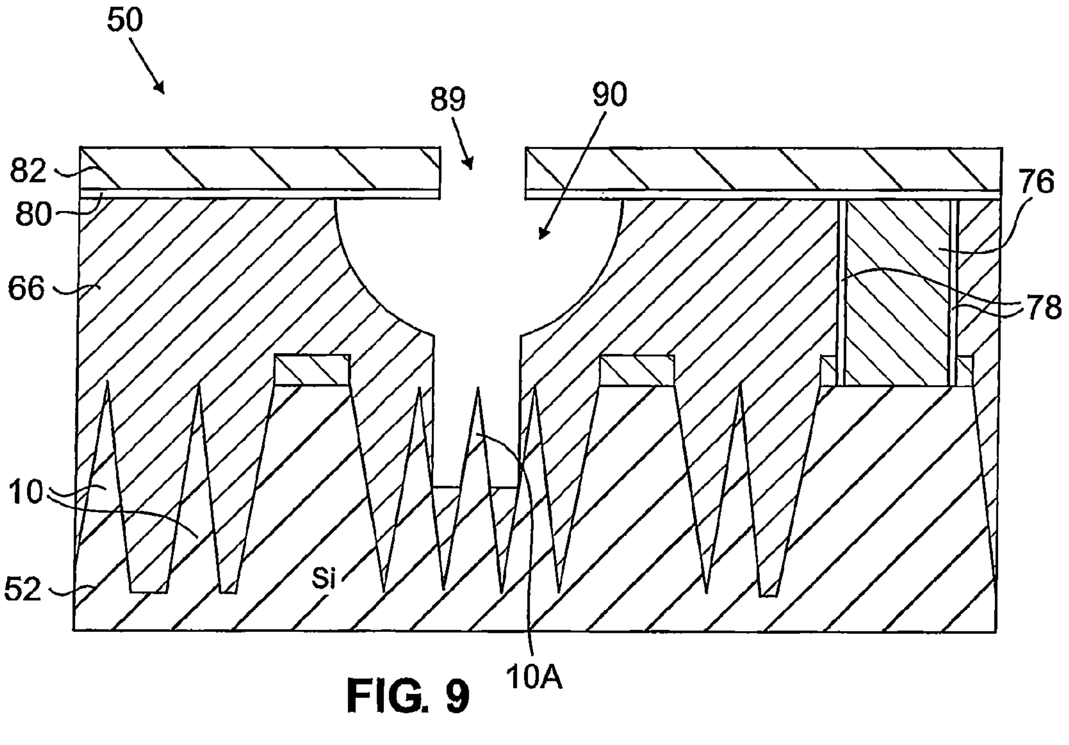

Using the opening 88 as a pattern, an opening 89 is formed in the aluminum layer 82, using a chlorine-based etch chemistry, for example. Through the opening 89, an opening 90 is formed in the material layer 80 and the silicon dioxide layer 66. As can be seen in FIG. 9, the opening 90 exposes the emission element 10A. The opening 90 is preferably formed using a dry cold fluorine-based isotropic etch to remove material from an upper region of the silicon dioxide layer 66, stopping prior to reaching material of the silicon layer 52, such as the emission element 10. A subsequent silicon-selective dry anisotropic etch removes additional material of the silicon dioxide layer 66. The described etch is known as a champagne glass etch, which is isotropic in the first step and non-selective to silicon. In the second step the etch is anisotropic and selective to silicon, otherwise the field emission elements would be eroded. During both etch steps the silicon dioxide is etched, while removal of underlying silicon in the silicon layer 52 and the emission elements 10 is minimized.

Figure 10:
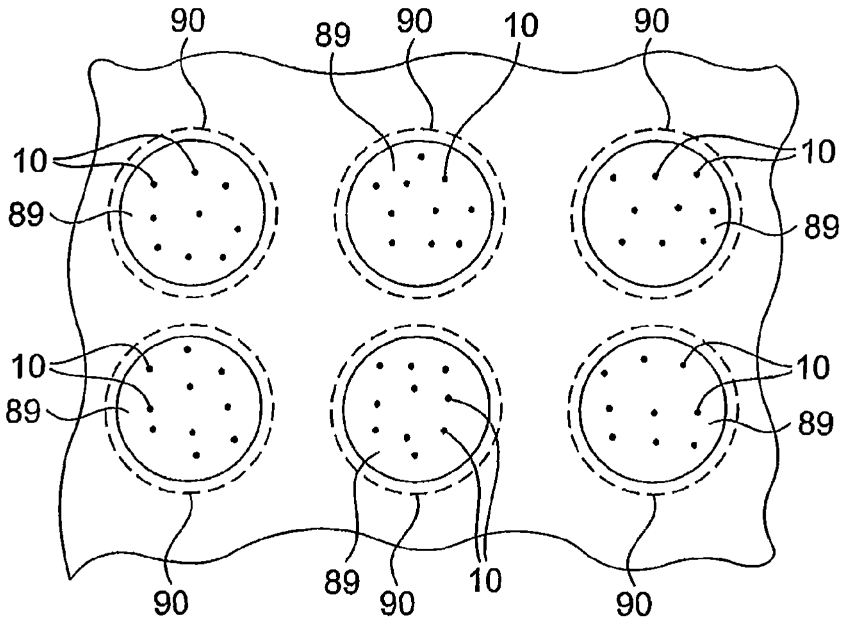
FIG. 10 is a top view of a plurality of emission elements formed according to the methods depicted in FIGS. 2-9.

After formation of the opening 90 the photoresist layer 84 is removed. Note that a plurality of emission elements 10 are formed within each opening 90, although only a single emission element 10 is illustrated in FIG. 9, which differentiates the present invention from the prior art techniques for forming emission elements. FIG. 10 illustrates a top view of a region of the substrate 50 depicting a plurality of emission elements 10 within each of a plurality of openings 89/90. A plurality of openings 89/90 (and the emission elements disposed therein) form an array element, with each such element providing electrons for a color pixel of the display. Thus a brighter image with a more uniform electron distribution and a more reliable display is provided according to the teachings of the present invention.

Figure 11:
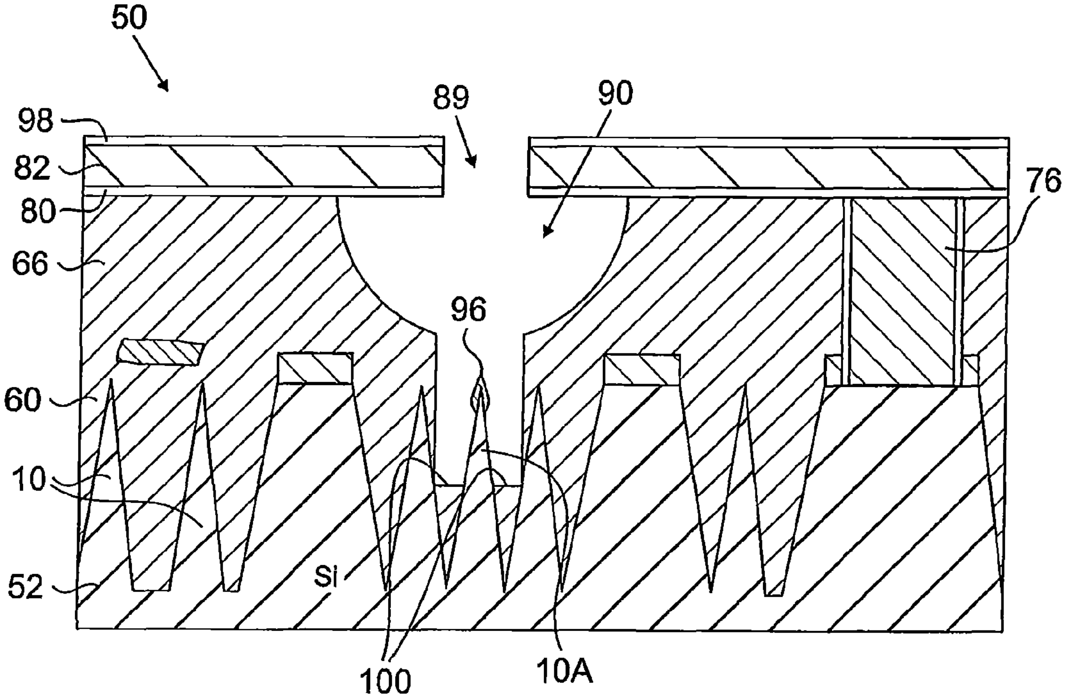
FIGS. 11-13 are additional cross-sectional illustrations of the substrate during subsequent sequential processing steps for forming field emission elements according to one method of the present invention.

A physical deposition process (according to one embodiment) deposits a material layer 96 over the tip 10A through the opening 90, and deposits a conductive layer 98 over the aluminum layer 82. See FIG. 11. A material of the material layer 96 exhibits a low work function for electron emissions such that electrons are emitted from the material layer 96 at relatively low voltages. In one embodiment, the material layer 96 extends to a surface 100 formed in the silicon dioxide layer 60. In one embodiment the material layer 96 provides a continuous coating over the emission elements 10; in another embodiment only the tips 10A are covered by the material layer 96. In yet another embodiment, both the material layer 96 and the conductive layer 98 are absent and electors are emitted from the emission elements 10 through the silicon layer 52.

As shown in FIG. 12, a photoresist layer 106 is deposited overlying the substrate 50 and patterned to form an opening 108 therein.

Figure 13:
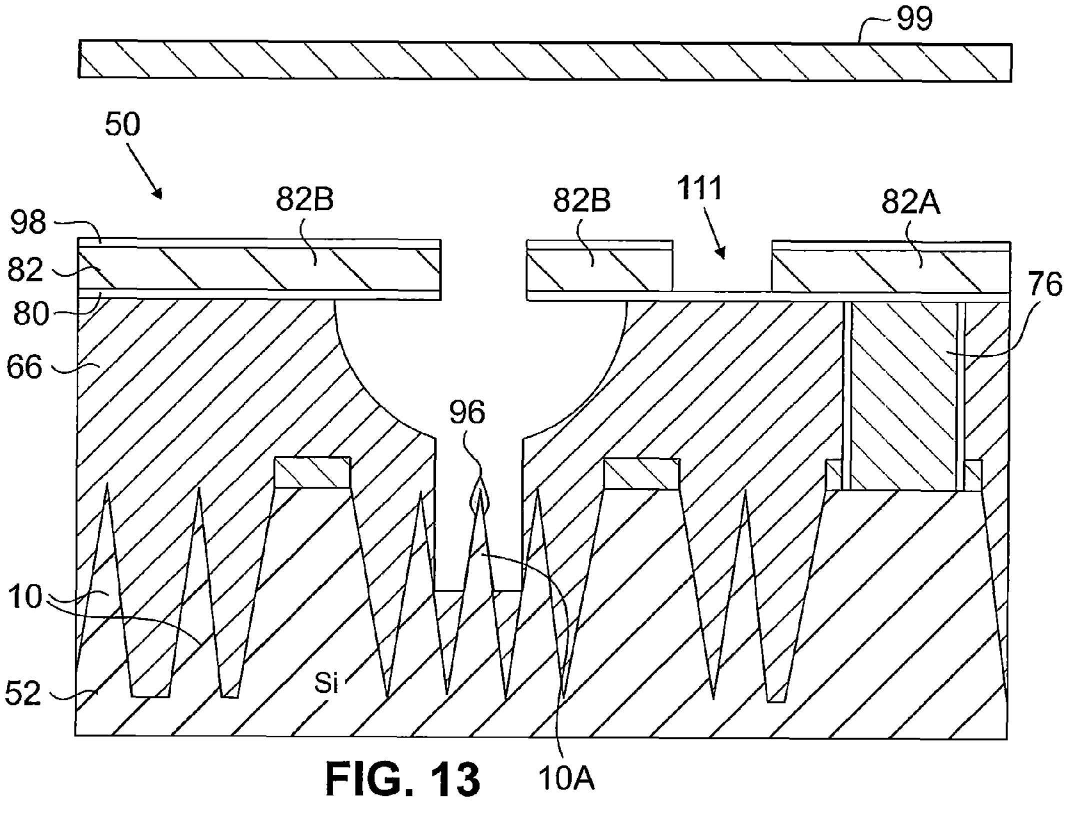

As illustrated in FIG. 13, the conductive layer 98 and the aluminum layer 82 are patterned according to the opening 108, forming an opening 111 therein that isolates the conductive plug 76 and a region 82A of the aluminum layer 82 from regions 82B of the aluminum layer 82. The regions 82B (which are connected in a third dimension not illustrated in FIG. 13) function as the gate electrode 16, i.e., one terminal of the voltage source $V_g$ is connected to the regions 82B. The other terminal of the voltage source $V_g$ is connected to the silicon layer 52 and thus to the emission tip 10A through the region 82A and the conductive plug 76. Electrons are emitted from the emissive material layer 96 in response to the applied voltage $V_g$. The sharp point of each silicon emission tip 10A creates an electric field that facilitates electron emission from the material layer 96 toward an anode 99. In another embodiment, the material layer 96 is absent and the electrons are emitted directly from emitter elements 10 formed in the silicon layer 52 toward the anode 99. Exemplary materials suitable for use as an emissive material include diamonds, (either chemical vapor deposited, natural diamond grits or synthetic diamonds, doped or undoped) graphite, metals such as molybdenum, tungsten or cesium, compounds such as LaB6, YB6, AIN or combinations of these materials, and other low work function materials.

Figure 14:
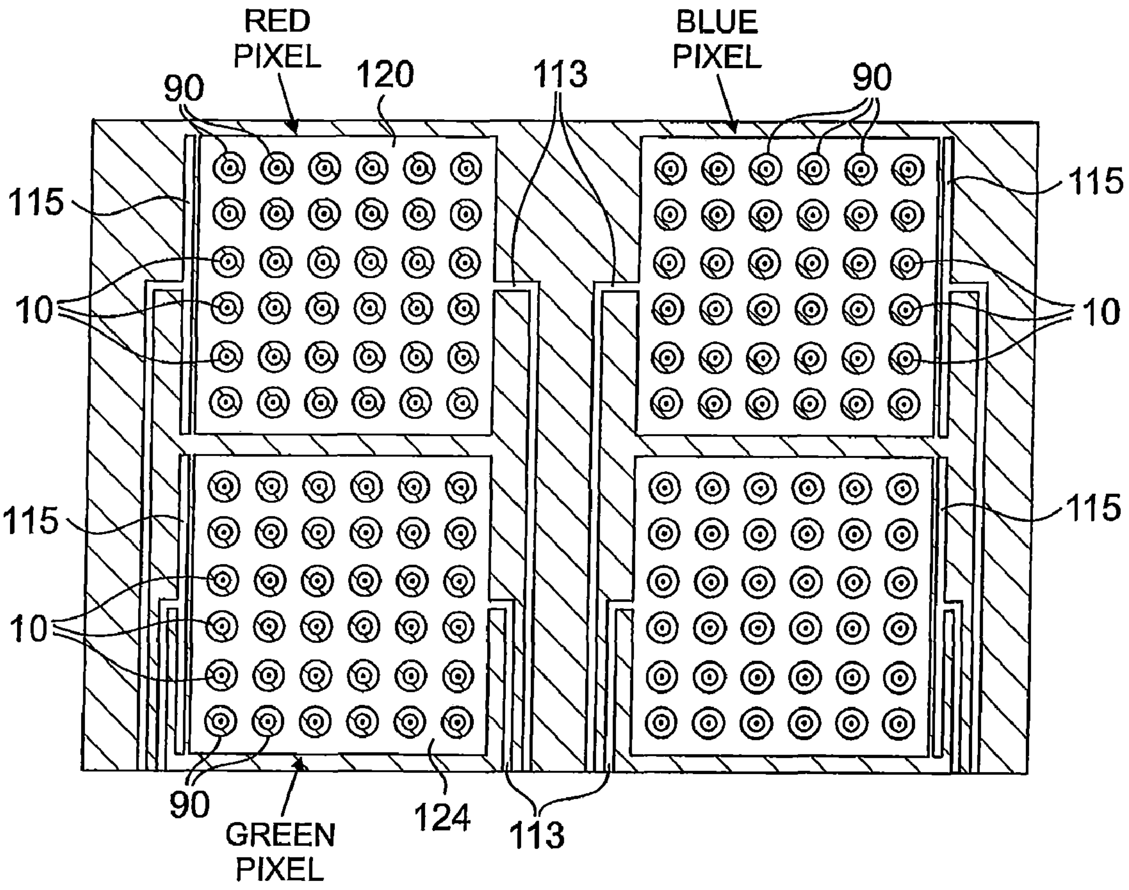
FIG. 14 is a top view of a plurality of emission elements formed according to the method depicted in FIGS. 2-9 and 11-13.

A top view of the completed structure is illustrated in FIG. 14, including grid conductors 113 and emission element conductors 115 for supplying the voltage $V_g$ between the gate electrode 16 and the emission elements 10. A controller, not shown, controls application of the voltage $V_g$ to certain of the emission element conductors 115 for causing emission elements 10 associated with those conductors to emit an electron flux.

A red sub-pixel array 120 comprises a plurality of emission elements 10 that when energized emit electrons that strike a red sub-pixel for producing a red color on the phosphor screen 25. Similarly, electrons emitted from a blue sub-pixel array 122, comprising a plurality of emission elements 10, impinge a blue sub-pixel to produce a blue color and electrons emitted from a green sub-pixel array 124, comprising a plurality of emission elements 10, impinge a green sub-pixel to produce a green color. As illustrated in FIG. 14, each pixel array 120, 122 and 124 comprises an array of openings 89/90, and each opening comprises a plurality of emission elements 10, although only one emission element 10 is depicted in each opening 89/90 for clarity.

An architecture and process have been described as useful for forming field emission elements in a semiconductor substrate. Specific applications and exemplary embodiments of the invention have been illustrated and discussed, which provide a basis for practicing the invention in a variety of ways and in a variety of circuit structures. Numerous variations are possible within the scope of the invention. Features and elements associated with one or more of the described embodiments are not to be construed as required elements for all embodiments. The invention is limited only by the claims that follow.

What is claimed is:

1. A method for fabricating field emission elements within a silicon substrate, comprising:

providing a plasma etching chamber;

supplying oxygen to the chamber;

supplying a silicon etchant to the chamber;

controlling a ratio of the oxygen to the silicon etchant;

etching silicon from the silicon substrate to form the emission elements in the substrate, wherein an upper surface of the emission elements exhibits a generally convergent shape;

forming a silicon dioxide layer over the emission elements;

forming a metal layer over the silicon dioxide layer;

forming an opening in the metal layer; and forming a cavity in the silicon dioxide layer through the opening by removing regions of the silicon dioxide layer so that the cavity extends under a portion of the metal layer and exposes a top portion of the emission elements, wherein a remnant of the silicon dioxide layer is located between a portion of the emission elements located within the cavity.

2. The method of claim 1 wherein the silicon substrate comprises a doped silicon substrate.

3. The method of claim 2 wherein the doped silicon substrate provides a conductive path from a surface of the doped silicon substrate to the emission elements.

4. The method of claim 1 wherein the emission elements are selected from between conical emission elements and pointed emission elements.

5. The method of claim 1 wherein the silicon etchant comprises sulfur hexafluoride.

6. The method of claim 1 wherein the silicon etchant comprises a material comprising an element from column VIIA of the period table.

7. The method of claim 1 wherein the silicon etchant comprises a combination of sulfur hexafluoride and hydrogen bromine.

8. The method of claim 7 wherein the step of etching is responsive to a relationship between of the amount of sulfur hexafluoride and the amount of hydrogen bromine supplied to the chamber.

9. The method of claim 1 wherein the oxygen reacts with the silicon to form silicon dioxide regions on an upper surface of the silicon substrate, and wherein during the step of etching the silicon dioxide regions act as masks relative to the underlying silicon.

10. The method of claim 9 wherein the emission elements comprise a tip structure, and wherein the silicon dioxide regions are disposed on a surface of the tip structure, and wherein the silicon dioxide regions promote directional etching to form the tip structure.

11. The method of claim 9 wherein the silicon dioxide regions prevent etching of silicon from the silicon substrate in a region immediately underlying each silicon dioxide region.

12. The method of claim 9 further comprising controlling a power supplied to the substrate to control formation of the silicon dioxide regions.

13. The method of claim 1 wherein the ratio is about 1.5 to 1.0.

14. The method of claim 1 wherein the step of supplying oxygen comprises supplying oxygen at a flow rate of about 30 sccm and the step of supplying the silicon etchant comprises supplying the at a flow rate of about 20 sccm.

15. The method of claim 1 wherein the oxygen reacts with the silicon to form silicon dioxide regions on an upper surface of the silicon substrate, and wherein the emission elements comprise a tip structure formed according to the etching step by etching silicon from the silicon substrate except in locations of the silicon dioxide regions, and wherein the silicon etchant exhibits a silicon etch rate greater than a silicon dioxide etch rate.

16. The method of claim 1 wherein each emission element comprises a tip region and a base region, wherein the tip region is smaller than the base region.

17. The method of claim 1 further comprising forming an electron emissive material layer overlying the exposed emission elements, wherein a material of the electron emissive layer exhibits a work function sufficient to permit the emission of electrons therefrom in response to a voltage applied between the emission elements and a grid spaced apart from the emission elements.

18. The method of claim 1 further comprising forming a conductive layer over an upper surface of the silicon dioxide layer and forming a conductive contact extending from the conductive layer through the silicon dioxide layer to the silicon substrate to provide electrical contact from the conductive layer to the silicon substrate.

19. A method for fabricating field emission elements within a doped silicon substrate, comprising:

forming a plurality of micro-masks on the silicon substrate;

etching silicon from the silicon substrate between the micro-masks to form a plurality of emission elements comprising an upper tip region having a smaller area than an area of a lower base region; and forming a silicon dioxide layer over the emission elements;

forming a metal layer over the silicon dioxide layer;

forming an opening in the metal layer; and forming a cavity in the silicon dioxide layer through the opening by removing regions of the silicon dioxide layer so that the cavity extends under a portion of the metal layer and exposes a top portion of the emission elements, wherein a remnant of the silicon dioxide layer is located between a portion of the emission elements located within the cavity.

20. The method of claim 19 wherein the step of etching comprises etching by charged ions and uncharged radicals.

21. The method of claim 20 wherein the step of etching further comprises isotropic etching and anisotropic etching.

22. The method of claim 20 wherein the step of forming the plurality of micro-masks further comprises forming the plurality of micro-masks by supplying oxygen for combining with the silicon etchants.

23. The method of claim 20 wherein the step of forming the plurality of micro-masks further comprises forming the plurality of micro-masks by supplying oxygen for combining with the silicon etchants.

* * * * *